United States Patent
Reynolds et al.

(10) Patent No.: US 8,575,788 B2
(45) Date of Patent: Nov. 5, 2013

(54) METHOD OF OPERATING A THERMOELECTRIC GENERATOR

(75) Inventors: Michael G. Reynolds, Troy, MI (US); Joshua D. Cowgill, Hartland, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 449 days.

(21) Appl. No.: 13/029,523

(22) Filed: Feb. 17, 2011

(65) Prior Publication Data
US 2012/0212190 A1    Aug. 23, 2012

(51) Int. Cl.
*G05F 3/06*    (2006.01)

(52) U.S. Cl.
USPC .......................................................... 307/151

(58) Field of Classification Search
USPC .......................................................... 307/151
See application file for complete search history.

(56) References Cited

U.S. PATENT DOCUMENTS

2010/0270996 A1*  10/2010  Ramadas et al. .............. 323/311

\* cited by examiner

*Primary Examiner* — Robert L. DeBerradinis
(74) *Attorney, Agent, or Firm* — Quinn Law Group, PLLC

(57) ABSTRACT

A method for operating a thermoelectric generator supplying a variable-load component includes commanding the variable-load component to operate at a first output and determining a first load current and a first load voltage to the variable-load component while operating at the commanded first output. The method also includes commanding the variable-load component to operate at a second output and determining a second load current and a second load voltage to the variable-load component while operating at the commanded second output. The method includes calculating a maximum power output of the thermoelectric generator from the determined first load current and voltage and the determined second load current and voltage, and commanding the variable-load component to operate at a third output. The commanded third output is configured to draw the calculated maximum power output from the thermoelectric generator.

11 Claims, 2 Drawing Sheets

US 8,575,788 B2

METHOD OF OPERATING A THERMOELECTRIC GENERATOR

This invention was made with U.S. Government support under an Agreement/Project number: DE-FC26-04NT42278, awarded by the Department of Energy. The U.S. Government may have certain rights in this invention.

TECHNICAL FIELD

This disclosure relates generally to controlling the load supplied by a thermoelectric generator.

BACKGROUND

The thermoelectric effect involves the direct conversion of temperature differences to electric voltage and vice versa. A thermoelectric device creates a voltage when there is a sufficient temperature differential across the device. Conversely, when a sufficiently-strong voltage is applied to the thermoelectric device, it creates a temperature difference.

Thermoelectric devices may be used to measure temperature, to generate electricity, to cool objects, or to heat objects. Thermoelectric devices are solid-state devices and generally have no moving parts. Thermoelectric generators (also called thermogenerators) are thermoelectric devices which convert heat—in the form of temperature differences—directly into electrical energy, using the Seebeck effect.

SUMMARY

A method for operating a thermoelectric generator supplying power to a variable-load component is provided. The method includes commanding the variable-load component to operate at a first output, and determining a first load current and a first load voltage to the variable-load component while operating at the commanded first output. The method also includes commanding the variable-load component to operate at a second output and determining a second load current and a second load voltage to the variable-load component while operating at the commanded second output.

The method includes calculating a maximum power output of the thermoelectric generator from the determined first load current and voltage and the determined second load current and voltage, and commanding the variable-load component to operate at a third output. The commanded third output is configured to draw the calculated maximum power output from the thermoelectric generator.

The above features and advantages and other features and advantages of the present invention are readily apparent from the following detailed description of the best modes and other embodiments for carrying out the invention when taken in connection with the accompanying drawings.

DESCRIPTION

Figure 1:
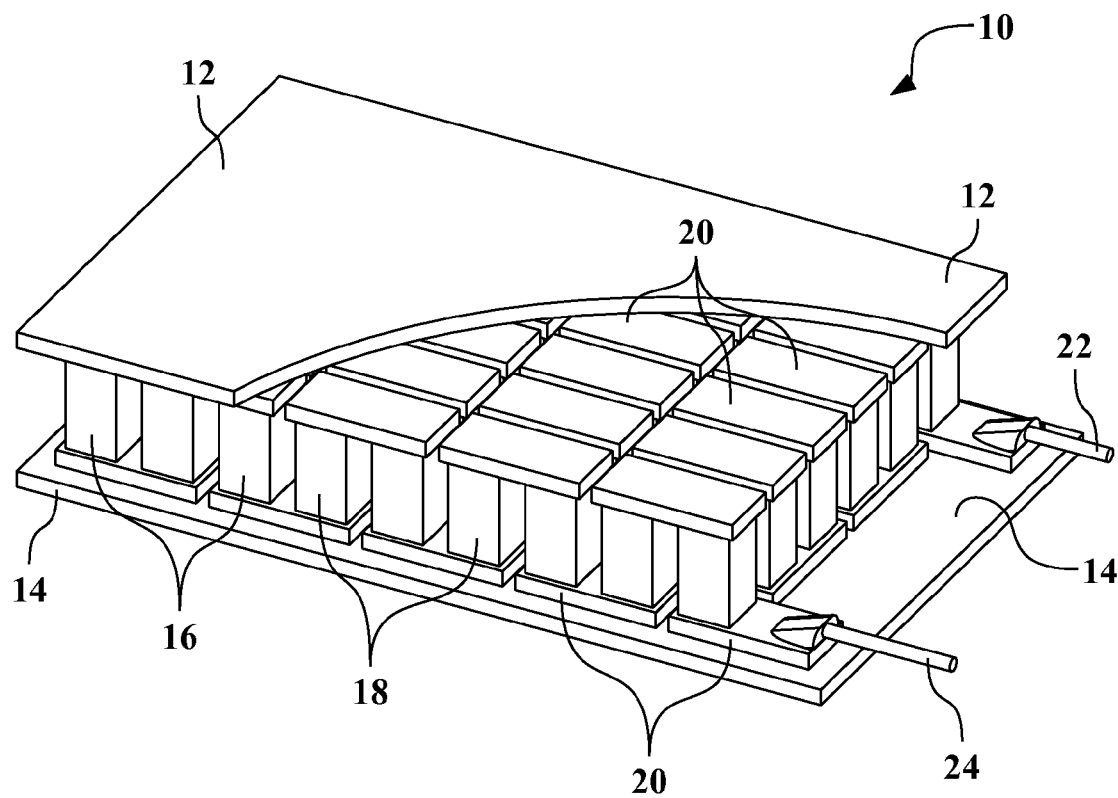
FIG. 1 is a schematic, isometric view of a thermoelectric generator.

Referring to the drawings, wherein like reference numbers correspond to like or similar components throughout the several figures, there is shown in FIG. 1 a thermoelectric (TE) generator 10. There are two sides to the TE generator 10, a heat-absorbed side and a heat-rejected side. The heat-absorbed side is kept at a higher temperature than the heat-rejected side, and thus heat energy flows from the hotter side to the cooler side. Some of the heat energy flowing through the TE generator 10 is converted to electrical energy if the TE generator 10 is connected to an electrical load. Depending upon the configuration, the TE generator 10 may also be operated as a thermoelectric heater or a thermoelectric cooler, and may, therefore, be more-generally referred to as a thermoelectric device.

A first substrate 12 may be either the heat-absorbed side or the heat-rejected side of the TE generator 10. A second substrate 14 forms the opposing side. In FIG. 1, a portion of the first substrate 12 is shown removed or cut-away to better illustrate the interior of the TE generator 10. For example and without limitation, when the TE generator 10 is used in a vehicle (not shown), one of the first and second substrates 12, 14 may be in direct heat-exchange communication with hot exhaust gases and the other of the first and second substrates 12, 14 may be in direct heat-exchange communication with a radiator, cooling fins, or with the engine coolant (none of which are shown in FIG. 1).

N-type thermoelectric elements 16 are paired with p-type thermoelectric elements 18. N-type and p-type elements are different semiconductors based upon the type dopants and the electric conductivity of the semiconductors. The relative location and type of the thermoelectric elements 16, 18; the exact geometry and interconnection of the pairs of thermoelectric elements 16, 18; and the number of the thermoelectric elements 16, 18 shown is illustrative only and is not intended to limit the scope of the claimed invention.

The pairs of thermoelectric elements 16, 18 are connected by a plurality of metal interconnects 20. A first electrical connection 22 and a second electrical connection 24 provide electrical communication with thermoelectric elements 16, 18 and, therefore, with the TE generator 10.

The pairs of thermoelectric elements 16, 18 create a direct-current (DC) voltage that is generally proportional—although not necessarily linearly proportional—to the temperature difference across the TE generator 10. The pairs of thermoelectric elements 16, 18 also have an internal resistance that is generally increasing with increasing average temperature of the TE generator 10.

Therefore, by heating one of the first and second substrates 12, 14 relative to the other, a DC voltage is created between the electrical connections 22, 24. By connecting the TE generator 10 to an electrical load, DC current is driven from the TE generator 10 through the electrical connections 22, 24 to the load. The power generated by the TE generator 10 may be used to power auxiliary electrical loads or accessory loads in the vehicle.

The exhaust gas temperature and flow rate may closely track engine output power. However, because the DC voltage and the resistance of the TE generator 10 are generally proportional to, and variable with, the temperature across the TE generator 10, and the TE generator 10 may be heated by the exhaust gas, the voltage generated by the TE generator 10 may fluctuate greatly. Therefore, voltage and power output of the TE generator 10 may change dramatically with driving demands. Furthermore, the resistance of the TE generator 10 will change—though possibly less dramatically than the voltage change—with changing engine load.

Figure 2:
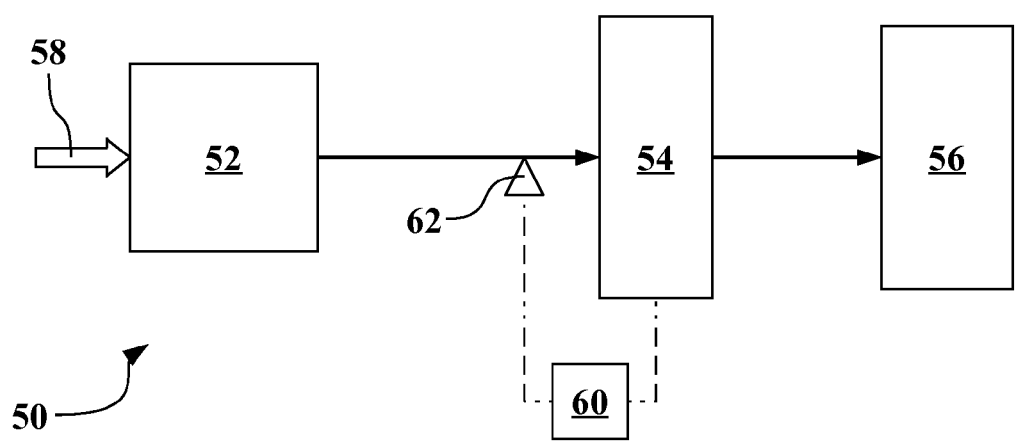
FIG. 2 is a schematic box diagram of a power delivery system using a thermoelectric generator, such as that shown in FIG. 1.

Referring now to FIG. 2, and with continued reference to FIG. 1, there is shown a schematic box diagram of a power delivery system 50. A thermoelectric (TE) generator 52, which may be similar to the TE generator 10 shown in FIG. 1, supplies DC voltage and current to a variable-load component, such as a DC-DC converter 54.

The DC-DC converter 54 converts power supplied by the TE generator 52 to an electrical system 56, which may include the accessory loads for the vehicle. The vehicle accessory loads may include, without limitation: motors, fans, lights, audio and video systems, controllers, navigation systems, and other electrically-powered components and systems within the vehicle. Alternatively, the electrical system 56 may include an energy storage device that is charged, at least in part, by power from the TE generator 52.

A heat source 58 provides a variable temperature-differential input to the TE generator 52. The heat source 58 may be, as discussed above, the temperature differential between vehicle exhaust gas and radiator fluid, or may be another temperature differential available on the vehicle. Therefore, the output voltage and power from the TE generator 52 is also variable.

The diagram of FIG. 2 includes a highly-schematic controller or control system 60. The control system 60 may include one or more components (not separately shown) with a storage medium and a suitable amount of programmable memory, which are capable of storing and executing one or more algorithms or methods to control of the DC-DC converter 54 and other components of the vehicle. Each component of the control system 60 may include distributed controller architecture, such as a microprocessor-based electronic control unit (ECU). Additional modules or processors may be present within the control system 60. The control system 60 may be incorporated into a Hybrid Control Processor (HCP) when the vehicle is a hybrid or hybrid-electric vehicle.

A sensor 62 is in communication with the input to the DC-DC converter 54, and is configured to measure, sense, or otherwise determine at least one of the voltage and current entering the DC-DC converter 54. The sensor 62 communicates the voltage and current to the control system 60, which may read the voltage and current—along with other information—to operate the power delivery system 50. The control system 60 and the sensor 62 may be incorporated into the DC-DC converter 54, such that the DC-DC converter 54 is aware of the input voltage and current and calculates its own operating states.

Based upon a command signal from the control system 60, the DC-DC converter 54 operates at either a commanded output current ($I_{cmd}$) or a commanded output voltage ($V_{cmd}$). The non-commanded output voltage or output current will vary based upon the commanded output current or commanded output voltage, respectively. For illustrative purposes, the DC-DC converter 54 shown in FIG. 2 will be discussed herein as operating based upon the commanded output current. Therefore, changing the commanded output current from the control system 60 to the DC-DC converter 54 will change the load supplied by the TE generator 52.

The input to the TE generator 52 is the variable heat energy from the heat source 58, and the outputs from the TE generator 52 are the variable voltage and variable current supplied to the DC-DC converter 54. The inputs to the DC-DC converter 54 are the variable voltage and variable current supplied by the TE generator 52, and the outputs from the DC-DC converter 54 are the controlled command current and the resulting output voltage to the electrical system 56.

The TE generator 52 supplies variable voltage based upon fluctuations of the heat source 58. The instantaneous voltage supplied from the TE generator 52, when the current delivered by the TE generator 52 is zero, may be referred to as an equivalent voltage ($V_{TE}$) of the TE generator 52. In order to maximize the power supplied by the TE generator 52 to the DC-DC converter 54 and the electrical system 56, the load voltage drawn by the DC-DC converter 54 needs to be optimized to allow maximum power output from the TE generator 52.

Maximum power from the TE generator 52 is achieved when the input load voltage to the DC-DC converter 54 is substantially one-half of the equivalent voltage of the TE generator 52. The optimal load voltage to the DC-DC converter 54 is controllable via the commanded output current for the DC-DC converter 54, but the actual equivalent voltage from the TE generator 52 is not known and may be difficult to predict or estimate based upon the heat source 58. Therefore, the control system 60 is configured to determine actual equivalent voltage from the TE generator 52 and calculate the optimal load voltage for the DC-DC converter 54 to draw the maximum available power from the TE generator 52.

Figure 3:
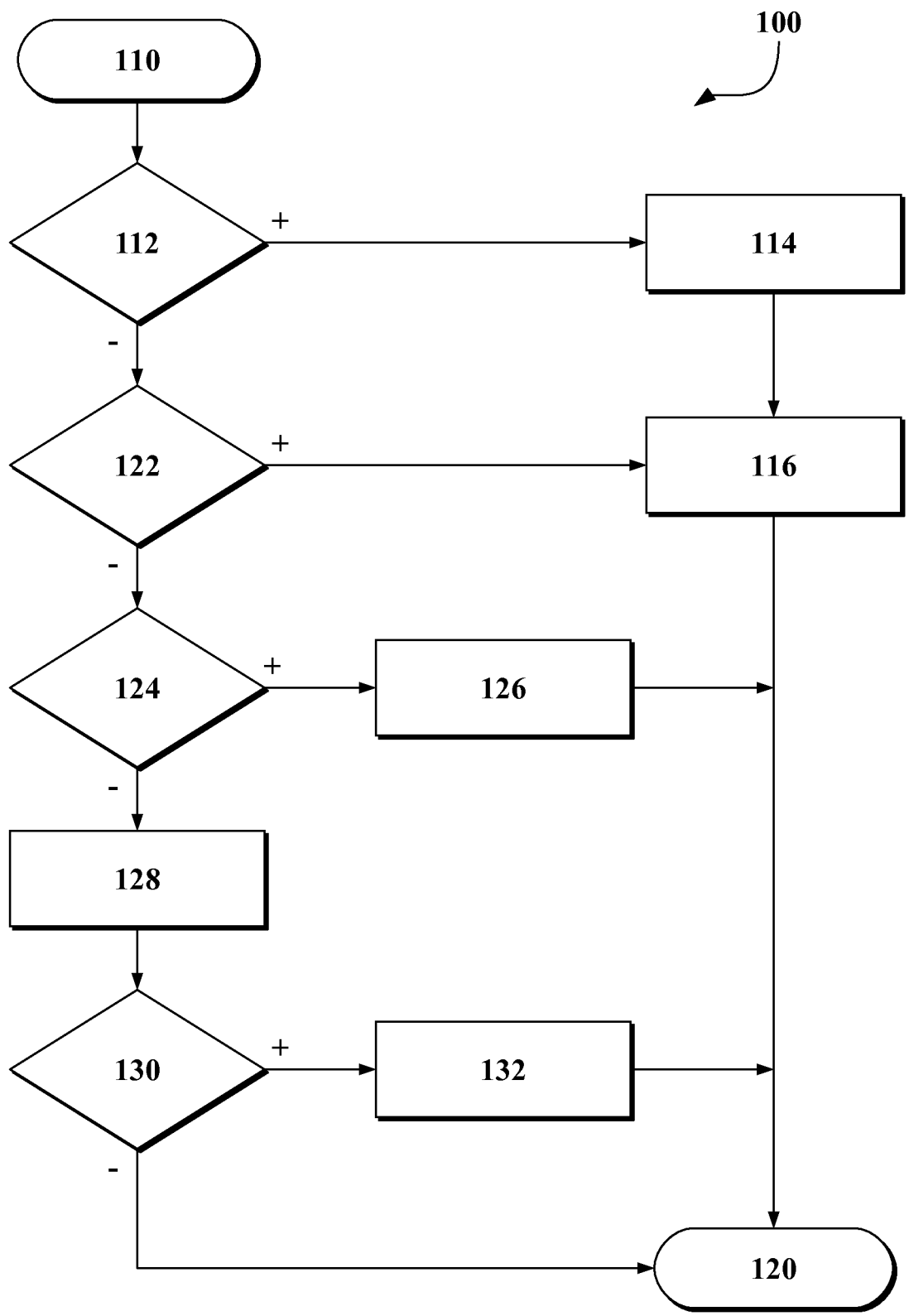
FIG. 3 shows a schematic flow chart diagram of an algorithm or method for operating a thermoelectric generator supplying a variable-load component, such as those illustrated in FIG. 2.

Referring now to FIG. 3, and with continued reference to FIGS. 1-2, there is shown a schematic flow chart diagram of a method or algorithm 100 for operating a thermoelectric device, such as the TE generator 52 shown in FIG. 2. The exact order of the steps of the method or algorithm 100 shown in FIG. 3 is not required. Steps may be reordered, steps may be omitted, and additional steps may be included. Furthermore, the algorithm 100 may be a portion or sub-routine of another algorithm or method. FIG. 3 shows only a high-level diagram of the algorithm 100.

For illustrative purposes, the algorithm 100 may be described with reference to the elements and components shown and described in relation to FIG. 2. However, other components may be used to practice the algorithm 100 and other components may be used to practice the invention defined in the appended claims. Any of the steps may be executed by multiple components within the control system 60 or another control architecture.

Step 110: Start; Read Voltage and Current.

The algorithm 100 may begin at a start or initialization step, during which time the algorithm 100 is monitoring operating conditions of the DC-DC converter 54 or the vehicle. Initiation may occur in response to a signal from the control system 60. The algorithm 100 includes reading the measured, instant load voltage and the measured or calculated load current being input to the DC-DC converter 54. Either the sensor 62 or the DC-DC converter 54 may be measuring the load voltage and load current read by the algorithm 100. The control system 60 may also be checking the rationality of the load voltage and current, such that extreme outliers may be disregarded as errors in measurement or calculation.

The algorithm 100 is accounting for three time periods or segments: a first time period, a second time period, and a third time period. The first time period is a previous time period ($t_i$); the second time period is a current time period ($t_j$) and is being read during the current iteration of the algorithm 100; and the third time period is a subsequent time period ($t_k$) which will follow the current iteration of the algorithm 100 until the algorithm iterates again. Therefore, the algorithm 100 is reading, measuring, or estimating the currently-operating load voltage ($V_j$) and the load current ($I_j$) of the input to the DC-DC converter 54.

The actual length of the time periods may be on the order of 1-10 milliseconds, such that the time periods may actually be modeled as instantaneous events. When the algorithm 100 and the control system 60 are measuring, determining, or reading a quantity (voltage or current), it may be assumed that the quantity is substantially constant over the duration of the time period or that the quantity read is an average which approximates the instantaneous quantity during the time period.

The time lapse between the previous time period ($t_i$) and the current time period ($t_j$), and therefore the time lapse between iterations of the algorithm 100, may be configured such that the equivalent voltage ($V_{TE}$) from the TE generator 52 is unlikely to substantially change. For example, when the heat source 58 includes exhaust gas, portions of the adjacent exhaust system may be formed from metal and may provide thermal inertia to smooth changes in the temperature differential experienced by the TE generator 52.

Step 112: First Time through Algorithm?

The algorithm 100 determines whether it is the first time through any loop or iteration of the algorithm 100. For example, when the vehicle has very recently been started or begun operating, the algorithm 100 will have an initial or first loop. The algorithm 100 may be running or looping on a specific schedule whenever the vehicle is in use, or may be called upon to run periodically—such as, without limitation, once every 1 to 3 seconds.

As viewed in FIG. 3, basic decision steps answered positively (as a yes) follow the path labeled with a "+" sign (the mathematical plus or addition operator). Similarly, decision steps answered negatively (as a no) follow the path labeled with a "−" sign (the mathematical minus or subtraction operator).

Step 114: Initiate Variables.

After determining that it is the first time through the algorithm 100, the algorithm 100 initiates the variables. For example, the previous load voltage ($V_i$) and the previous load current ($I_i$) may be set to a predetermined value or to zero, because there was no previous iteration of the algorithm 100 to have set those values.

Step 116: Set Output Command to Zero.

Because the algorithm 100 is on its first iteration, there is insufficient information to determine the optimal operating conditions for the DC-DC converter 54 to draw maximum power from the TE generator 52. Furthermore, the DC-DC converter 54 may not have been turned on yet. Therefore, the commanded output current ($I_{cmd}$) for the DC-DC converter 54 is set to zero.

Step 120: End; Write Output Command, Set Next Variables.

The algorithm 100 writes the commanded output current for the DC-DC converter 54 at its end step. The commanded output current is the level at which the DC-DC converter 54 will operate until the next iteration of the algorithm 100. The algorithm 100 also rewrites the measured current quantities ($V_j$, $I_j$) to be recognized as the previous quantities ($V_i$, $I_i$) for the next loop.

Once the algorithm 100 has iterated more than once, more information may be available for the algorithm 100, and the commanded output current may be configured to draw the calculated maximum power output from the TE generator 52. Operating at the commanded output current ($I_{cmd}$) from the current iteration until the next iteration results in the DC-DC converter 54 drawing at a third load voltage ($V_k$) for the subsequent time period ($t_k$). The algorithm 100 determines the commanded output current in order to cause operation of the DC-DC converter 54 at the third load voltage for the subsequent time period.

As the algorithm 100 is called upon to run again, it returns to the start step 110. The algorithm 100 will again read or calculate the load voltage and load current ($V_j$, $I_j$), which may be compared to the previous load voltage and load current ($V_i$, $I_i$) from the previous iteration, and may be used to determine the equivalent voltage of the TE generator 52. Alternatively stated, the algorithm 100 is determining a second load current and a second load voltage to the DC-DC converter 54 (variable-load component) while operating at the second output, as compared to determining a first load current and a first load voltage to the DC-DC converter 54 while operating at the first output.

Step 122: Load Voltage Less than Minimum Voltage?

After the algorithm 100 determines that it is not on the first iteration, the algorithm 100 proceeds to compare the measured load voltage ($V_j$) to a minimum voltage ($V_{min}$). The minimum voltage is the level below which there is no attempt at operating the DC-DC converter 54. Below the minimum voltage, inefficiencies of the DC-DC converter 54 may result in no usable power output for the electrical system 56. The minimum voltage may be a predetermined value or may be substantially equivalent to another operational characteristic, such as the overall DC voltage (nominally, 14 volts) of the vehicle or the electrical system 56.

If the load voltage is below the minimum voltage, the algorithm 100 again proceeds to set the commanded output current for the DC-DC converter 54 to zero at step 116. Then the algorithm 100 proceeds to step 120 to write the commanded output current and to rewrite the measured current quantities ($V_j$, $I_j$) to be recognized as the previous quantities ($V_i$, $I_i$) for the next loop.

Step 124: Load Current Equal to Previous Load Current?

If the load voltage is above the minimum voltage, the algorithm 100 determines that the TE generator 52 is operating at levels which justify operation of the DC-DC converter 54. The algorithm 100 will then proceed to determine whether the measured load current ($I_j$) is substantially equal to the previous load current ($I_i$). The algorithm 100 may require that the measured load current ($I_j$) and the previous load current ($I_i$) are separated by a predetermined amount (such as, without limitation, 5 to 10 percent).

The algorithm 100 calculates the equivalent voltage ($V_{TE}$) of the TE generator 52 based upon the load voltage and the load current inputs to the DC-DC converter 54 at two different time periods: the previous time period ($t_i$), and the current, measured time period ($t_j$). However, in order to overcome noise levels of the DC-DC converter 54 and make the calculation, the measured load current ($I_j$) must be different from the previous load current ($I_i$). Therefore, the commanded first output current and the commanded second output current must be different enough to result in the measured load current being sufficiently different from the previous load current.

Step 126: Increase Output Command.

If the measured load current is substantially equal to the previous load current, the algorithm 100 will correct this by increasing or decreasing the commanded output current for the DC-DC converter 54. The change may be made by adding a predetermined command differential, which is configured to result in the DC-DC converter 54 operating with sufficiently-different measured load current on the subsequent iteration of the algorithm 100. Changing the load current to achieve different current quantities ($V_j$, $I_j$) and previous quantities ($V_i$, $I_i$) may be referred to as dithering the load drawn by the DC-DC converter 54.

After changing the commanded output current by the predetermined command differential, the algorithm 100 will again proceed to step 120 to write commanded output current to the DC-DC converter 54 and begin operating at the increased commanded output current. The algorithm 100 also rewrites the measured current quantities ($V_j$, $I_j$) to be recognized as the previous quantities ($V_i$, $I_i$) for the next loop.

Step 128: Calculate Equivalent Voltage, Subsequent Load Voltage, and Optimal Output Command.

If the measured load current is not substantially equal to the previous load current, the data is sufficient to actually calculate the equivalent voltage ($V_{TE}$) being supplied by the TE generator 52. From the equivalent voltage being supplied by the TE generator 52, the control system 60 can also calculate the third or subsequent load voltage ($V_k$) for the DC-DC converter 54. This subsequent load voltage is calculated to draw the maximum amount of power from the TE generator 52, now that its equivalent voltage output is known.

The optimal commanded output current for the DC-DC converter 54 is calculated to yield the subsequent load voltage from the DC-DC converter 54. However, both the subsequent load voltage and the optimal commanded output current are unconstrained values, based only upon what would be needed to maximize power output from the TE generator 52. However, the DC-DC converter 54 may have limitations on the actual subsequent load voltage or current that the DC-DC converter 54 can actually handle.

Step 130: Subsequent Load Voltage within Range?

The algorithm 100 will determine whether the subsequent load voltage is within a predetermined range or within constraint limitations. The range may be set based upon operating constraints of the DC-DC converter 54 or based upon other considerations. The range may include both a maximum and a minimum subsequent load voltage (or the associated load currents), such that the algorithm 100 is comparing the commanded subsequent load voltage to a minimum load voltage constraint and to a maximum load voltage constraint.

Furthermore, the commanded output current flowing from the DC-DC converter 54 to the electrical system 56 may also have constraints. For example, excessive current may adversely affect operations of the accessories within the electrical system 56.

If either the unconstrained commanded output current or the unconstrained subsequent load voltage calculated after determining the equivalent voltage of the TE generator 52 violates operating limits, the algorithm 100 may have to bring the commanded output current away from the optimal levels. Depending upon the comparison, the algorithm 100 will either constrain or proceed directly to the end step 120 to write the commanded output current.

Step 132: Constrain Output Command.

If the algorithm 100 determines that the subsequent load voltage is outside of the minimum load voltage constraint or the maximum load voltage constraint, it will adjust to bring the subsequent load voltage back within the acceptable range. If the subsequent load voltage is outside of the range, the algorithm 100 will reduce or increase the commanded output current until the load voltage of the DC-DC converter 54 is just within the range.

Whether the algorithm 100 has to reduce or increase the subsequent load voltage to bring it within the acceptable range, the algorithm 100 will then proceed to step 120 to write the constrained commanded output current to the DC-DC converter 54 and begin operating at the commanded output current. The algorithm 100 also rewrites the measured current quantities ($V_j$, $I_j$) to be recognized as the previous quantities ($V_i$, $I_i$) for the next loop.

Therefore, if the commanded third load voltage (i.e. the unconstrained subsequent load voltage) is below the minimum load voltage constraint, the algorithm 100 will command the DC-DC converter 54 to operate at a fourth output current. The commanded fourth output current is configured to cause the DC-DC converter 54 to operate at the minimum load voltage constraint. Similarly, if the commanded third load voltage is above the maximum load voltage constraint, the algorithm 100 will command the DC-DC converter 54 to operate at a fifth output current, which is configured to cause the DC-DC converter 54 to operate at the maximum load voltage constraint.

If, however, the algorithm 100 determines that the subsequent load voltage is within the range of the minimum load voltage constraint and the maximum load voltage constraint, it proceeds directly to writing the optimal commanded output current. Therefore, if the commanded third load voltage is between the minimum load voltage constraint and the maximum load voltage constraint, the algorithm 100 will command the DC-DC converter 54 to operate at the optimal output current.

The algorithm 100 will then proceed to step 120 and write the optimal (unconstrained) commanded output current to the DC-DC converter 54 and begin operating at the optimal commanded output current. The algorithm 100 also rewrites the measured current quantities ($V_j$, $I_j$) to be recognized as the previous quantities ($V_i$, $I_i$) for the next loop.

Subsequent loops of the algorithm 100 will attempt to determine the equivalent voltage of the TE generator 52 and the subsequent load voltage of the DC-DC converter 54 which will maximize power output from the TE generator 52. The subsequent loops of the algorithm 100 will also determine whether the optimal command current for the DC-DC converter 54 needs to be constrained before beginning operation of the DC-DC converter 54 at that level.

While the present invention is described in detail with respect to automotive applications, those skilled in the art will recognize the broader applicability of the invention. Those having ordinary skill in the art will recognize that terms such as "above," "below," "upward," "downward," et cetera, are used descriptively of the figures, and do not represent limitations on the scope of the invention, as defined by the appended claims.

While the best modes and other modes for carrying out the claimed invention have been described in detail, those familiar with the art to which this invention relates will recognize various alternative designs and embodiments for practicing the invention within the scope of the appended claims.

The invention claimed is:

1. A method for operating a thermoelectric generator supplying power to a variable-load component, comprising:
    commanding the variable-load component to operate at a first output;
    determining a first load current and a first load voltage to the variable-load component while operating at the commanded first output;
    commanding the variable-load component to operate at a second output;
    determining a second load current and a second load voltage to the variable-load component while operating at the commanded second output;
    calculating a maximum power output of the thermoelectric generator from the determined first load current and voltage and the determined second load current and voltage; and
    commanding the variable-load component to operate at a third output, wherein the commanded third output is configured to draw the calculated maximum power output from the thermoelectric generator.

2. The method of claim 1,
    wherein calculating the maximum power output of the thermoelectric generator includes calculating an equivalent voltage of the thermoelectric generator; and wherein commanding the variable-load component to operate at the commanded third output includes calculating a third load voltage, wherein the third load voltage is substantially twice the calculated equivalent voltage of the thermoelectric generator, and the commanded third output is configured to cause the variable-load component to operate at the calculated third load voltage.

3. The method of claim 2, wherein the variable-load component is a DC-DC converter.

4. The method of claim 3, wherein the commanded first output is a first output current, the commanded second output is a second output current, and the commanded third output is a third output current.

5. The method of claim 4, wherein the commanded first output current and the commanded second output current are separated by at least a predetermined command differential.

6. The method of claim 5, further comprising:
comparing the commanded third load voltage to a minimum load voltage constraint and a maximum load voltage constraint;
if the commanded third load voltage is between the minimum load voltage constraint and the maximum load voltage constraint, commanding the DC-DC converter to operate at the third output current;
if the commanded third load voltage is below the minimum load voltage constraint, commanding the DC-DC converter to operate at a fourth output current, wherein the commanded fourth output current is configured to cause the DC-DC converter to operate at the minimum load voltage constraint; and
if the commanded third load voltage is above the maximum load voltage constraint, commanding the DC-DC converter to operate at a fifth output current, wherein the commanded fifth output current is configured to cause the DC-DC converter to operate at the maximum load voltage constraint.

7. A method for operating a thermoelectric generator supplying power to a variable-load component, comprising:
commanding the variable-load component to operate at a first output current;
determining a first load current and a first load voltage to the variable-load component while operating at the commanded first output current;
commanding the variable-load component to operate at a second output current, wherein the commanded first output current and the commanded second output current are separated by at least a predetermined command differential;
determining a second load current and a second load voltage to the variable-load component while operating at the commanded second output current;
calculating a maximum power output of the thermoelectric generator from the determined first load current and voltage and the determined second load current and voltage; and
commanding the variable-load component to operate at a third output current, wherein the commanded third output current is configured to draw the calculated maximum power output from the thermoelectric generator.

8. The method of claim 7, wherein the variable-load component is a DC-DC converter.

9. The method of claim 8,
wherein calculating the maximum power output of the thermoelectric generator includes calculating an equivalent voltage of the thermoelectric generator; and
wherein commanding the variable-load component to operate at the commanded third output current includes calculating a third load voltage, wherein the third load voltage is substantially twice the calculated equivalent voltage of the thermoelectric generator, and the commanded third output current is configured to cause the variable-load component to operate at the calculated third load voltage.

10. The method of claim 9, further comprising:
comparing the commanded third load voltage to a minimum load voltage constraint and a maximum load voltage constraint;
if the commanded third load voltage is between the minimum load voltage constraint and the maximum load voltage constraint, commanding the DC-DC converter to operate at the third output current;
if the commanded third load voltage is below the minimum load voltage constraint, commanding the DC-DC converter to operate at a fourth output current, wherein the commanded fourth output current is configured to cause the DC-DC converter to operate at the minimum load voltage constraint; and
if the commanded third load voltage is above the maximum load voltage constraint, commanding the DC-DC converter to operate at a fifth output current, wherein the commanded fifth output current is configured to cause the DC-DC converter to operate at the maximum load voltage constraint.

11. A method for operating a thermoelectric generator supplying power to a variable-load component, comprising:
commanding the variable-load component to operate at a first output;
determining a first load current and a first load voltage to the variable-load component while operating at the commanded first output;
commanding the variable-load component to operate at a second output, wherein the commanded first output and the commanded second output are separated by at least a predetermined command differential;
determining a second load current and a second load voltage to the variable-load component while operating at the commanded second output;
calculating a maximum power output of the thermoelectric generator from the determined first load current and voltage and the determined second load current and voltage, including calculating an equivalent voltage of the thermoelectric generator;
commanding the variable-load component to operate at a third output, wherein the commanded third output is configured to draw the calculated maximum power output from the thermoelectric generator, wherein commanding the variable-load component to operate at the commanded third output includes calculating a third load voltage, wherein the third load voltage is substantially twice the calculated equivalent voltage of the thermoelectric generator, and the commanded third output is configured to cause the variable-load component to operate at the calculated third load voltage; and
comparing the commanded third load voltage to a minimum load voltage constraint and a maximum load voltage constraint, and:
if the commanded third load voltage is between the minimum load voltage constraint and the maximum load voltage constraint, commanding the DC-DC converter to operate at the third output;
if the commanded third load voltage is below the minimum load voltage constraint, commanding the DC- DC converter to operate at a fourth output, wherein the commanded fourth output is configured to cause the DC-DC converter to operate at the minimum load voltage constraint; and if the commanded third load voltage is above the maximum load voltage constraint, commanding the DC-DC converter to operate at a fifth output, wherein the commanded fifth output is configured to cause the DC-DC converter to operate at the maximum load voltage constraint.

* * * * *